(12) United States Patent
Cha et al.

(10) Patent No.: US 9,246,050 B2
(45) Date of Patent: Jan. 26, 2016

(54) METHOD FOR FABRICATING NANO-PATTERNED SUBSTRATE FOR HIGH-EFFICIENCY NITRIDE-BASED LIGHT-EMITTING DIODE

(71) Applicant: HUNETPLUS CO., LTD., Nonsan (KR)

(72) Inventors: Hyuk-Jin Cha, Asan (KR); Heon Lee, Seoul (KR); Eun-Seo Choi, Ansan (KR)

(73) Assignee: HUNETPLUS CO., LTD., Nonsan (KR)

( * ) Notice: Subject to any disclaimer, the term of this patent is extended or adjusted under 35 U.S.C. 154(b) by 0 days.

(21) Appl. No.: 14/394,739

(22) PCT Filed: Apr. 17, 2013

(86) PCT No.: PCT/KR2013/003233
§ 371 (c)(1),
(2) Date: Oct. 16, 2014

(87) PCT Pub. No.: WO2013/157842
PCT Pub. Date: Oct. 24, 2013

(65) Prior Publication Data
US 2015/0093847 A1  Apr. 2, 2015

(30) Foreign Application Priority Data
Apr. 19, 2012  (KR) .................. 10-2012-0040785

(51) Int. Cl.
H01L 27/15 (2006.01)
H01L 33/00 (2010.01)
H01L 21/02 (2006.01)
H01L 21/3105 (2006.01)
H01L 21/311 (2006.01)
H01L 33/20 (2010.01)
H01L 33/22 (2010.01)
H01L 33/12 (2010.01)

(52) U.S. Cl.
CPC .......... *H01L 33/007* (2013.01); *H01L 21/0237* (2013.01); *H01L 21/0254* (2013.01); *H01L 21/02356* (2013.01); *H01L 21/02639* (2013.01); *H01L 21/02647* (2013.01); *H01L 21/311* (2013.01); *H01L 21/3105* (2013.01); *H01L 33/12* (2013.01); *H01L 33/20* (2013.01); *H01L 33/22* (2013.01); *H01L 2933/0033* (2013.01)

(58) Field of Classification Search
CPC ................... H01L 2924/00; H01L 2924/0002; H01L 2224/48091; H01L 33/06; H01L 33/32; H01L 2924/00014; H01L 25/0753; H01L 33/0075; H01L 33/005; H01L 33/44; H01L 2933/0041; H01L 33/20; H01L 33/22
USPC .............. 257/E29.324, E21.001; 438/43, 415
See application file for complete search history.

(56) References Cited

FOREIGN PATENT DOCUMENTS

| JP | 2005-064492 A | 3/2005 |
|---|---|---|
| JP | 2007-243659 A | 10/2007 |
| JP | 2007-273659 A | 10/2007 |
| KR | 10-2009-0116212 A | 11/2009 |
| KR | 10-2010-0011835 A | 2/2010 |

*Primary Examiner* — Mark A Laurenzi
(74) *Attorney, Agent, or Firm* — Mintz Levin Cohn Ferris Glovsky and Popeo, P.C.; Kongsik Kim

(57) ABSTRACT

Provided is a method of manufacturing a substrate for a light emitting diode including a convex section forming step and a crystallization/crystallizing step. According to the method and the substrate for the light emitting diode, light extraction is significantly improved and nano to micron sized pattern, economically formed.

15 Claims, 4 Drawing Sheets

METHOD FOR FABRICATING NANO-PATTERNED SUBSTRATE FOR HIGH-EFFICIENCY NITRIDE-BASED LIGHT-EMITTING DIODE

TECHNICAL FIELD

The present invention is provided to: economically manufacture a nano to micron sized pattern on a substrate of a light emitting diode including a convex section, which includes any one selected from the group consisting of $SiO_2$, $Si_3N_4$, and a combination thereof, using a nano printing or nano imprinting process; efficiently form the nano to micron sized pattern on the substrate of the light emitting diode formed of sapphire monocrystal and the like, using this process; and form gallium nitride or the like having a small crystal defect—thereby significantly increasing performance of the light emitting diode.

BACKGROUND ART

A light emitting diode is receiving attention as a light source for future lighting and widely used as a light source in various fields at present due to a long lifespan, small power consumption, and environment-friendliness in comparison with lighting fixtures such as conventional fluorescent lamp, incandescent lamp, and so on. In particular, since the nitride-based light emitting diode having a large bandgap has an advantage capable of emitting light of a region from green to blue and a region of near ultraviolet rays, application fields such as LCDs and mobile phone backlights, lightings for automobiles, traffic lights, general lightings, and so on, are being widely enlarged. However, performance of the nitride-based light emitting diode is not being sufficiently improved to satisfy such needs.

The performance of the light emitting diode is generally determined based on internal quantum efficiency according to how many photons are generated by injected (injection) electrons and light extraction efficiency according to how many photons can be emitted to an outside of a light emitting diode device.

In recent times, while the internal photon efficiency of the nitride-based light emitting diode has been largely improved due to development of the epitaxial growth technique, the light extraction efficiency is very low in comparison with the internal photon efficiency. When light generated in a multi quantum well (MQW) region, which is an active layer (a light emitting layer) of the light emitting diode, is emitted, total reflection is generated at a boundary between the light emitting diode device, external air, and an external sealing material such as epoxy, sapphire substrate, or the like. Since GaN has a refractive index of about 2.5, which is relatively larger than those of air ($n_{air}$=1), epoxy ($n_{epoxy}$=1.5), and sapphire ($n_{sap.}$=1.77), critical angle regions in which the light generated in the MQW can exit to the outside of the device are $\theta_{GaN/air}$=23°, $\theta_{GaN/epoxy}$=37°, and $\theta_{GaN/sap.}$=45°, which are very limited. Accordingly, the light departing from the critical angle range and entering in a direction toward the outside of the device cannot advance to the outside but is totally reflected until the light is absorbed in the device, and thus, the light extraction efficiency is merely several percent (%), which is very low. In addition, this causes problems leading to generation of heat in/of the device.

In order to overcome the limitation of the nitride-based light emitting diode, a research has been attempted for effectively reducing total reflection through diffused reflection of light by inserting a pattern into a p-GaN layer or a transparent electrode layer of a surface of the device. In particular, it is known that, when a sub-micron photonic crystal pattern in which patterns having a uniform size are regularly and densely arranged is introduced in a light emitting diode manufacturing process, the light extraction efficiency is largely increased. However, in consideration of formation of a p-type electrode after patterning, a manufacturing process of the light emitting diode such as a packaging process or the like and production yield, it is difficult to actually commercialize the patterning process of the p-GaN layer and the transparent electrode layer. Alternatively, when the epitaxial layer is grown on a patterned sapphire substrate (PSS), similarly, the light extraction efficiency may be effectively improved due to the diffused reflection effect of the light. In the case of the PSS, essentially, the technique developed to reduce a treading dislocation density due to lattice mismatch between the sapphire substrate and the GaN epitaxial layer and increase the internal photon efficiency, or the light extraction efficiency may also be significantly improved, and may be applied to the manufacturing process of the light emitting diode. Currently, in manufacturing companies of the light emitting diodes in domestic and foreign countries, products to which the PSS are applied are in a mass production stage.

DETAILED DESCRIPTION

Technical Problem

Currently, the patterned sapphire substrate (PSS) is mainly manufactured through a photolithography process and a dry and wet etching process, and specification of most of the patterns is about several microns. An extent in improvement of the light extraction efficiency of the light emitting diode due to the diffused reflection of the light is largely varied according to size, shape, cycle, or the like, of the patterns. It is known that, when a nano photonic crystal pattern is applied to a light emitting region of the light emitting diode, light extraction is largely increased. Accordingly, a diameter and cycle of the micro pattern of a conventionally commercialized PSS should be reduced to a nano grade to improve the efficiency of the light emitting device, and a shape of the pattern should (also) be optimized.

Since the photolithography, which is a patterning technique used for manufacturing of the PSS, is expensive and application of the nano to micron sized pattern increases manufacturing cost of products and significantly decreases economic feasibility, the light extraction efficiency cannot be easily improved through the conventional method and the PSS. Accordingly, in order to additionally improve efficiency of the light emitting diode, instead of the expensive photolithography, a patterning technique capable of economically manufacturing the nano to micron sized pattern is needed.

In addition, a process of coating a gallium nitride film, which has a small amount of lattice defects, on a sapphire substrate or the like having the nano to micron sized pattern is needed. As a result, total reflection in the substrate may be reduced and light emission efficiency may be improved.

Solution to Problem

It will be understood that although terms such as "first" and "second" may be used herein to describe various elements, these elements should not be limited by these terms. These terms are only used to distinguish one element from another.

In order to accomplish the above-mentioned aspects, a method of manufacturing a substrate for a light emitting diode according to an embodiment of the present invention includes a convex section forming step of forming a convex section including any one selected from the group consisting of $SiO_2$, $Si_3N_4$, and a combination thereof on one surface of the substrate through a nano printing or nano imprinting method; and a crystallization step of annealing the substrate including the convex section and crystallizing the convex section of the nano to micron sized pattern.

The convex section forming step may include a nano imprinting method including: a first step of forming a pattern material coating layer on the substrate using a solution including any one selected from the group consisting of a precursor of $SiO_2$, a precursor of $Si_3N_4$ and a combination thereof, and a second step of positioning and pressing a nano mold against the pattern material coating layer and forming the convex section.

The convex section forming step may include a nano printing method including: a third step of forming the pattern material coating layer on one surface of the nano mold using the solution including any one selected from the group consisting of the precursor of $SiO_2$, the precursor of $Si_3N_4$ and the combination thereof, and a fourth step of positioning and pressing the nano mold having the pattern material coating layer against the substrate and forming the convex section. A curing step may be further included between the third step and the fourth step.

In the convex section forming step, the substrate may be processed through UV ozone processing, piranha solution processing, $O_2$ processing, or plasma processing to improve adhesive force with the convex section.

The pressing of the nano printing or nano imprinting may be performed at 100 to 250° C. and 1 to 30 bars (units of pressure).

The nano to micron sized pattern may include a bottom section and a convex section, and a lower end diameter of the convex section may be 0.1 to 3 times a light emission wavelength of the light emitting diode.

The bottom section and the convex section of the nano to micron sized pattern may be alternately repeatedly formed, and a formation cycle of a first convex section and a second convex section adjacent to the first convex section may be 0.2 to 6 times the light emission wavelength of the light emitting diode The nano to micron sized pattern may repeatedly include any one selected from the group consisting of a hemispherical shape, a triangular pyramidal shape, a quadrangular pyramidal shape, a hexagonal pyramidal shape, a conical shape, and a semi- or cut-spherical shape.

The substrate may be any one selected from the group consisting of a sapphire substrate, a silicon substrate, and a quartz substrate. When the substrate is the sapphire substrate, the convex section including any one selected from the group consisting of $SiO_2$, $Si_3N_4$, and a combination thereof is formed on the substrate, and as a gallium nitride film is formed thereon, a seed is formed on the bottom section to which the sapphire substrate is exposed so that a gallium nitride crystal grows; and thus, lattice defects may be significantly reduced.

The substrate may include any one selected from the group consisting of $Al_2O_3$, SiC, Si, $SiO_2$, quartz, AlN, GaN, $Si_3N_4$, and MgO.

A light emitting diode according to another embodiment of the present invention is a substrate for a light emitting diode, which includes a substrate and a convex section formed on one surface of the substrate, wherein: the convex section has a repeatedly formed nano to micron sized pattern, a lower end diameter of the convex section is 0.1 to 3 times a light emission wavelength of the light emitting diode, and a formation cycle of a first convex section and a second convex section adjacent to the first convex section is 0.2 to 6 times the light emission wavelength of the light emitting diode, (thereby) providing the surface for the light emitting diode capable of forming the gallium nitride film or the like having a small amount of crystal defects.

Advantageous Effects of Invention

In the present invention, as a diameter and a cycle of a pattern of a substrate for a light emitting diode are reduced to a nano grade, internal photon efficiency and light manufacturing a nano to micron sized pattern on a substrate using a nano print (or imprint) lithography technique, which is an economic and non-optical patterning technique, is presented. Since the nano print (or imprint) technique enables transfer of a pattern onto a large area through an economic and simple process without necessity of expensive exposure equipment, production yield may be increased. In particular, since the patterning for the light emitting diode does not require precise alignment, the nano print (or imprint) process, which is a direct pattern transfer method, may be appropriately applied, and a sub-micron pattern may be easily formed. Accordingly, in comparison with the conventional photolithography process for manufacturing the PSS, when the nano print (or imprint) technique is applied to the PSS process, performance of the product may be further improved and economic feasibility may be accomplished, and mass production of high efficiency PSS light emitting diode becomes possible. Furthermore, when a material such as gallium nitride is formed on the substrate of the light emitting diode (e.g., the sapphire substrate) including the convex section, for example, of $SiO_2$ or $Si_3N_4$, the material may be formed to significantly reduce crystal defects. Thus, a probability of light emitted in a light emitting device being scattered and (thereby) reducing internal total extraction efficiency of the light emitting diode is significantly minimized; light emitting performance of the device may be noticeably improved. Further, the present invention may be applied to a top emission light emitting diode, a flip-chip light emitting diode, and a vertical light emitting diode, which are conventional light emitting diodes.

REFERENCE SIGNS LIST

Figure 1:
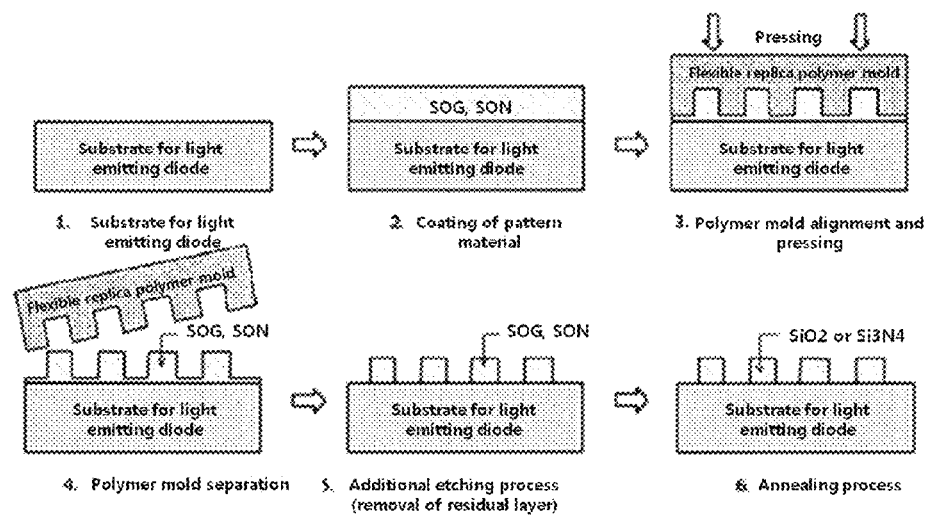
FIG. 1 is a schematic view showing a method of manufacturing of a substrate for a light emitting diode according to an embodiment of the present invention.

A: Lower end diameter of convex section
B: Formation cycle of first convex section and second convex section

DESCRIPTION OF EMBODIMENTS

Hereinafter, embodiments of the present invention will be described with reference to the accompanying drawings such that the present invention can be easily performed by those skilled in the art. However, the present invention is not limited to the embodiment but may be implemented in various different ways. Like elements are designated by like reference numerals throughout the description.

Figure 2:
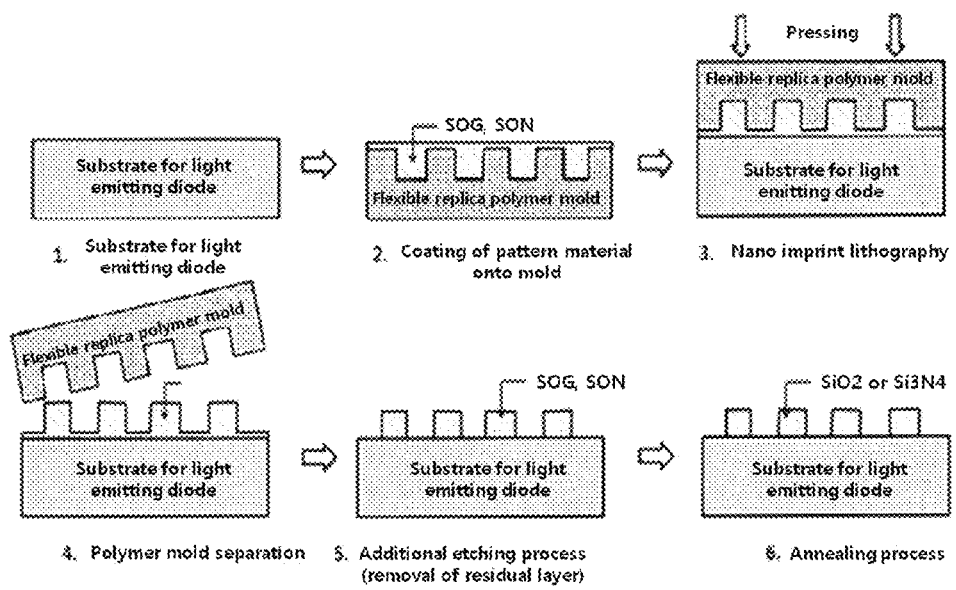
FIG. 2 is a schematic view showing a method of manufacturing a substrate for a light emitting diode according to another embodiment of the present invention.
Figure 3:
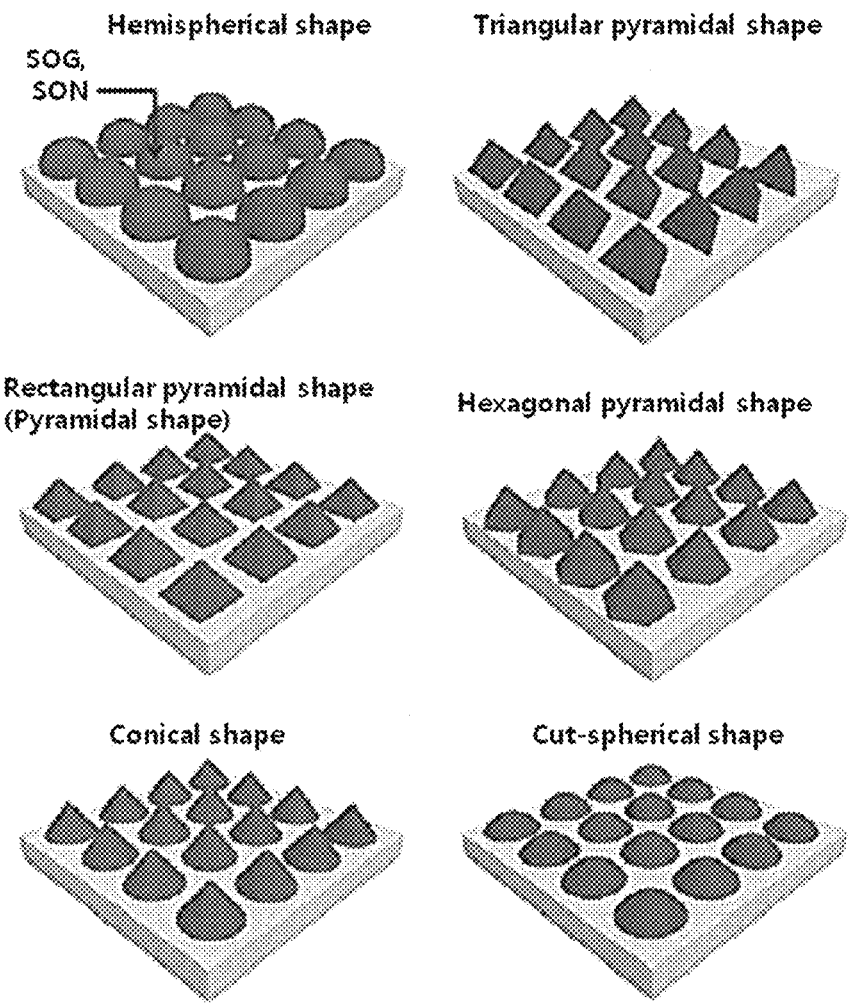
FIG. 3 is a conceptual view showing examples of various nano to micron sized patterns that may be applied to (the) embodiments of the present invention.
Figure 4:
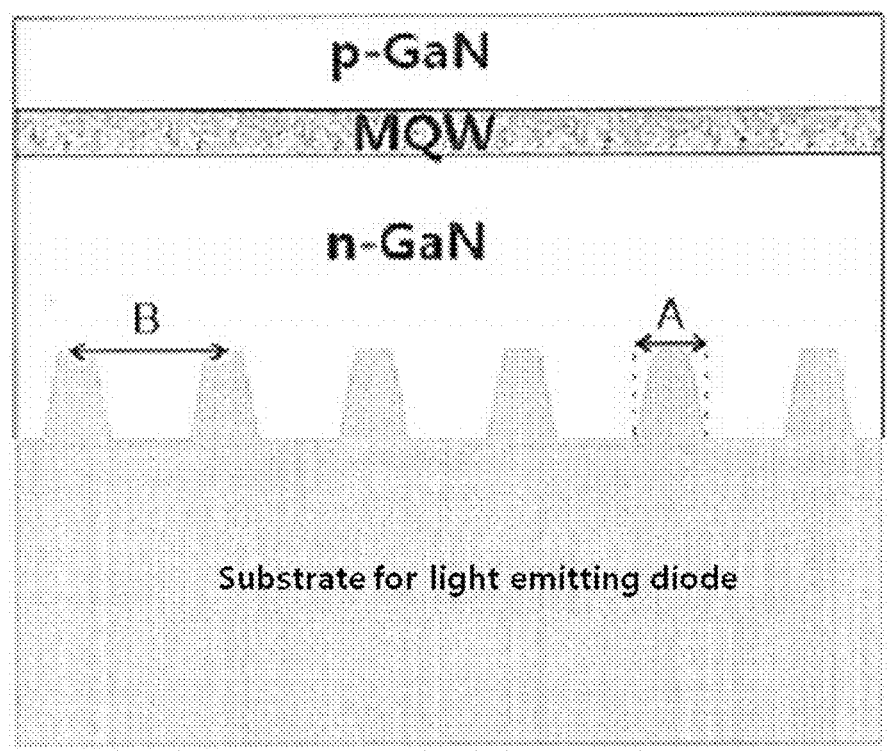
FIG. 4 is a conceptual view of a light emitting diode including a substrate for a light emitting diode manufactured according to an embodiment of the present invention.

FIG. 1 is a schematic view showing a manufacturing a substrate for a light emitting diode according to an embodiment of the present invention. FIG. 2 is a schematic view showing a method of manufacturing a substrate for a light emitting diode according to another embodiment of the present invention. FIG. 3 is a conceptual view showing an example of various nano to micron sized patterns that may be applied to (various) embodiments of the present invention. FIG. 4 is a conceptual view of a light emitting diode including a substrate for a light emitting diode manufactured according to the embodiment(s) of the present invention.

The method of manufacturing a substrate for a light emitting diode according to the embodiment of the present invention includes a convex section forming step of forming a convex section including any one selected from the group consisting of $SiO_2$, $Si_3N_4$, and a combination thereof on one surface of a substrate, and a crystallization step of annealing the substrate including the convex section to crystallize the convex section of the nano to micron sized pattern.

The convex section forming step may include nano imprinting including a first step of forming a pattern material coating layer on the substrate using a solution including any one selected from the group consisting of a precursor of $SiO_2$, a precursor of $Si_3N_4$, and a combination thereof; and a second step of positioning and pressing a nano mold on the pattern material coating layer to form the convex section. Before forming the pattern material coating layer, the substrate may be processed through UV ozone processing, piranha solution processing, $O_2$ processing, or plasma processing to improve an adhesive force between the substrate and the pattern material coating layer configured to (form) the convex section.

A mixture of silicon oxide and a polymer or a mixture of silicon nitride and a polymer may be applied as the precursor of the $SiO_2$ and the precursor of the $Si_3N_4$, and any material may be used as long as the pattern material coating layer are formed on the substrate. A specific example of the precursor of the $SiO_2$ may be hydrogen silsesquioxane (HSQ) or the like. An organic solvent such as ethanol, methanol, dimethylformamide (DMF), or the like may be used as a solvent applied to the solution, but it is not limited thereto.

The convex section forming step may include a third step of forming a pattern material coating layer on one surface of the nano mold using any one (solution) selected from the group consisting of the precursor of $SiO_2$, the precursor of $Si_3N_4$, and the combination thereof, and a fourth step of positioning and pressing the nano mold formed on the pattern material coating layer against the substrate to form the convex section. The third step may include a step of curing the pattern material coating layer. Before forming the convex section, the substrate may be processed through UV ozone processing, piranha solution processing, $O_2$ processing, or plasma processing to improve the adhesive force between the pattern material coating layer formed on the nano mold and the substrate.

The pressing of the nano printing or nano imprinting may be performed at 100 to 250° C. and 1 to 30 bars. The nano printing or nano imprinting may be effectively performed within the range of the temperature and pressure.

The nano mold may transfer the nano to micron sized pattern onto the substrate and may be a flexible replica polymer mold, which may be formed of a polymer material such as PDMS, h-PDMS, PVC, or the like.

The nano mold may be formed of a material capable of effectively absorbing the solvent of the solution that forms the pattern material coating layer. In this case, the convex section may be easily formed using the pattern material coating layer. The material may include any one polymer selected from the group consisting of PDMS, PVA, PDMS, and a combination thereof. In this case, since the nano mold is formed as a flexible polymer mold, the nano printing or nano imprinting may be easily performed. In addition, when the nano mold is formed of PDMS, solvent absorption ability of the solution that forms the pattern material coating layer may be improved due to high moisture permeability.

The nano mold may form the nano to micron sized pattern in which a lower end diameter A of the convex section formed on the substrate is 0.1 to 3 times a light emission wavelength of the light emitting diode. As shown in FIG. 4, the lower end diameter A denotes a diameter of a cross-section of the convex section of the surface of the convex section in contact with the bottom section.

The substrate may be a sapphire substrate, a silicon substrate, or a quartz substrate, which is used as an LED substrate. The substrate may include any one selected from the group consisting of $Al_2O_3$, SiC, Si, $SiO_2$, quartz, AlN, GaN, $Si_3N_4$, and MgO. The substrate may be applied as long as gallium nitride or the like is formed and grown from the bottom section of the substrate to form a gallium nitride film or the like having a small amount of lattice defects.

An etching step may be further included between the convex section forming step and the crystallization step, and the etching step may be dry etching or wet etching. The etching step may also be plasma etching. The etching step may remove a residual material of the pattern material coating layer remaining in the convex section forming step.

In the crystallization step in which the substrate including the convex section is annealed to crystallize the convex section of the nano to micron sized pattern, the annealing may be performed at 100 to 900° C.

The nano to micron sized pattern printed or imprinted on the substrate includes a bottom section and a convex section, and a lower end diameter of the convex section is 0.1 to 3 times the light emission wavelength of the light emitting diode. That is, provided that the light emission wavelength of the light emitting diode is λ, the lower end diameter of the convex section may be 0.1λ to 3λ, and the light emission wavelength of the light emitting diode may be applied to a wavelength of light, which is to be provided by the light emitting diode. When the lower end diameter of the convex section is within the range, lattice defects of the gallium nitride or the like grown from the bottom section on the substrate by the nano to micron sized pattern may be reduced, and thus, internal total reflection of the light emitting diode device may be reduced, and light emission efficiency of the light emitting diode, significantly increased.

The bottom section and the convex section of the nano to micron sized pattern may be alternately formed. A distance between a first convex section and a second convex section adjacent to the first convex section may be 0.2 to 6 times the light emission wavelength of the light emitting diode. And provided that the light emitting wavelength of the light emitting diode is λ, a formation cycle B of the first convex section and the second convex section adjacent to the first convex section may be 0.2λ to 6λ, and the pattern may be regularly and repeatedly formed. When the cycle of the nano to micron sized pattern is within the range, light emission efficiency of the light emitting diode may be remarkably increased.

As shown in FIG. 3, the nano to micron sized pattern may repeatedly include any one selected from the group consisting of a hemispherical shape, a triangular pyramidal shape, a quadrangular pyramidal shape, a hexagonal pyramidal shape, a conical shape, and a cut-spherical shape. Since the pattern is manufactured or formed using the nano printing or imprinting, desired shape of the pattern may be manufactured and applied according to a master template.

When the nano to micron sized patterns are formed in a three-dimensional shape having regularity, lattice mismatch of the GaN layer formed on the substrate may be reduced, and thus, the treading dislocation density may be reduced to increase the internal photon efficiency. In addition, while the light extraction efficiency may be slightly improved according to shapes of the patterns, low light extraction efficiency may (thereby) be improved by the diffused reflection in the diode.

The method of manufacturing the substrate for the light emitting diode may further include a buffer layer forming step of further forming a buffer layer formed as a GaN layer or the like on the substrate on which the crystallized convex section is formed, after the crystallization step. As the buffer layer is formed on the substrate in which the GaN is nano-patterned, lattice mismatch generated when the GaN is generally formed on the substrate can be reduced, and the lattice mismatch can be more precisely reduced by the nano to micron sized pattern. In addition, since the pattern may have a uniform size and cycle according to the wavelength of the light emitting diode, the diffused reflection that lowers the light extraction efficiency may be minimized, and the light extraction efficiency of the light emitting diode may be improved.

Further, while a patternable size is limited to a micron unit in the conventional photolithography (process), the nano to micron sized pattern may be patterned or formed on the substrate through the nano printing or nano imprinting in the present invention, and simultaneously, differently from the conventional photolithography process, a process of manufacturing the substrate for a light emitting diode and the light emitting diode including the same may be simplified.

A light emitting diode according to another embodiment of the present invention includes a substrate for a light emitting diode manufactured by the method of manufacturing the substrate for the light emitting diode. The light emitting diode may include a substrate and a convex section formed on one surface of the substrate and including any one selected from the group consisting of $SiO_2$, $Si_3N_4$ and a combination thereof. The convex section may be repeatedly formed in a nano to micron sized pattern, a lower end diameter of the convex section may be 0.1 to 3 times a light emission wavelength of the light emitting diode, and a formation cycle of a first convex section and a second convex section adjacent to the first convex section may be 0.2 to 6 times of the light emission wavelength of the light emitting diode.

FIG. 4 is a conceptual view of a light emitting diode of the present invention. Referring to FIG. 4, through the above-mentioned method, a substrate for a light emitting diode on which the convex section of the nano to micron sized pattern, and an n-GaN layer, an MQW layer, and p-GaN, which are formed thereon, may be sequentially formed. The convex section may be repeatedly formed, and a lower end diameter of the convex section may be 0.1 to 3 times the light emission wavelength of the light emitting diode. In addition, a formation cycle of a first convex section and a second convex section adjacent to the first convex section may be 0.2 to 6 times the light emission wavelength of the light emitting diode. The n-GaN layer may further include a buffer layer formed of GaN and formed at a lower end thereof, and the buffer layer may reduce lattice mismatch to improve light extraction efficiency.

In addition, the light emitting diode including the substrate for the light emitting diode may reduce residual stress after formation of a GaN film, which includes the buffer layer, and prevent bending thereof even when a diameter of the substrate is increased due to a regular nano to micron sized pattern and the buffer layer formed thereon of GaN.

The light emitting diode may be a top emission light emitting diode. The light emitting diode may be included in a flip-chip light emitting diode. The light emitting diode may also be applied to a vertical light emitting diode.

The foregoing description concerns exemplary embodiments of the present invention and is intended to be illustrative and should not be construed as limiting the invention. The teachings therein may be readily applied to other types of devices. Many alternatives, modifications, and variations are within the scope and spirit of the present invention and will be apparent to those skilled in the art.

The invention claimed is:

1. A method of manufacturing a substrate for a high efficiency nitride-based light emitting diode on which a nano to micron sized pattern is formed, comprising:
    a convex section forming step of forming a convex section including any one selected from the group consisting of $SiO_2$, $Si_3N_4$ and a combination thereof on one surface of the substrate; and
    a crystallization step of annealing the substrate including the convex section and crystallizing the convex section of the nano to micron sized pattern;
    wherein: in the convex section forming step, the substrate is processed through UV ozone processing, piranha solution processing, $O_2$ processing, or plasma processing to improve an adhesive force with the convex section,
    the nano to micron sized pattern comprises a bottom section and the convex section, and a lower end diameter of the convex section is 0.1 to 3 times a light emission wavelength of the light emitting diode,
    the bottom section and the convex section of the nano to micron sized pattern are alternately repeatedly formed, and a formation cycle of a first convex section and a second convex section adjacent to the first convex section is 0.2 to 6 times the light emission wavelength of the light emitting diode, and
    the nano to micron sized pattern repeatedly comprises any one selected from the group consisting of a hemispherical shape, a triangular pyramidal shape, a quadrangular pyramidal shape, a hexagonal pyramidal shape, a conical shape and a cut-spherical shape.

2. The method of manufacturing a substrate for a high efficiency nitride-based light emitting diode on which a nano to micron sized pattern is formed, according to claim 1, wherein the convex section forming step comprises a nano imprinting method comprising:
    a first step of forming a pattern material coating layer on the substrate using a solution comprising any one selected from the group consisting of a precursor of $SiO_2$, a precursor of $Si_3N_4$, and a combination thereof; and
    a second step of positioning and pressing a nano mold against the pattern material coating layer and forming the convex section.

3. The method of manufacturing a substrate for a high efficiency nitride-based light emitting diode on which a nano to micron sized pattern is formed, according to claim 1, wherein the convex section forming step comprises a nano printing method comprising:
    a third step of forming a pattern material coating layer on one surface of a nano mold using a solution comprising any one selected from the group consisting of a precursor of $SiO_2$, a precursor of $Si_3N_4$, and a combination thereof; and a fourth step of positioning and pressing the nano mold having the pattern material coating layer thereon against the substrate and forming the convex section.

4. The method of manufacturing a substrate for a high efficiency nitride-based light emitting diode on which a nano to micron sized pattern is formed, according to claim 2, wherein the pressing of the nano imprinting is performed at 100 to 250° C. and 1 to 30 bars.

5. The method of manufacturing a substrate for a high efficiency nitride-based light emitting diode on which a nano to micron sized pattern is formed, according to claim 3, wherein the pressing of the nano printing is performed at 100 to 250° C. and 1 to 30 bars.

6. A method of manufacturing a substrate for a high efficiency nitride-based light emitting diode on which a nano to micron sized pattern is formed, comprising:

a convex section forming step of forming a convex section including any one selected from the group consisting of $SiO_2$, $Si_3N_4$ and a combination thereof on one surface of the substrate; and a crystallization step of annealing the substrate including the convex section and crystallizing the convex section of the nano to micron sized pattern;

wherein: in the convex section forming step, the substrate is processed through UV ozone processing, piranha solution processing, $O_2$ processing, or plasma processing to improve an adhesive force with the convex section, the nano to micron sized pattern comprises a bottom section and the convex section, and a lower end diameter of the convex section is 0.1 to 3 times a light emission wavelength of the light emitting diode, the bottom section and the convex section of the nano to micron sized pattern are alternately repeatedly formed, and the nano to micron sized pattern repeatedly comprises any one selected from the group consisting of a hemispherical shape, a triangular pyramidal shape, a quadrangular pyramidal shape, a hexagonal pyramidal shape, a conical shape and a cut-spherical shape.

7. The method of manufacturing a substrate for a high efficiency nitride-based light emitting diode on which a nano to micron sized pattern is formed, according to claim 6, wherein the convex section forming step comprises a nano imprinting method comprising:

a first step of forming a pattern material coating layer on the substrate using a solution comprising any one selected from the group consisting of a precursor of $SiO_2$, a precursor of $Si_3N_4$, and a combination thereof; and a second step of positioning and pressing a nano mold against the pattern material coating layer and forming the convex section.

8. The method of manufacturing a substrate for a high efficiency nitride-based light emitting diode on which a nano to micron sized pattern is formed, according to claim 6, wherein the convex section forming step comprises a nano printing method comprising:

a third step of forming a pattern material coating layer on one surface of a nano mold using a solution comprising any one selected from the group consisting of a precursor of $SiO_2$, a precursor of $Si_3N_4$, and a combination thereof; and a fourth step of positioning and pressing the nano mold having the pattern material coating layer thereon against the substrate and forming the convex section.

9. The method of manufacturing a substrate for a high efficiency nitride-based light emitting diode on which a nano to micron sized pattern is formed, according to claim 7, wherein the pressing of the nano imprinting is performed at 100 to 250° C. and 1 to 30 bars.

10. The method of manufacturing a substrate for a high efficiency nitride-based light emitting diode on which a nano to micron sized pattern is formed, according to claim 8, wherein the pressing of the nano printing is performed at 100 to 250° C. and 1 to 30 bars.

11. A method of manufacturing a substrate for a high efficiency nitride-based light emitting diode on which a nano to micron sized pattern is formed, comprising:

a convex section forming step of forming a convex section including any one selected from the group consisting of $SiO_2$, $Si_3N_4$ and a combination thereof on one surface of the substrate; and a crystallization step of annealing the substrate including the convex section and crystallizing the convex section of the nano to micron sized pattern;

wherein: in the convex section forming step, the substrate is processed through UV ozone processing, piranha solution processing, $O_2$ processing, or plasma processing to improve an adhesive force with the convex section, the nano to micron sized pattern comprises a bottom section and the convex section, the bottom section and the convex section of the nano to micron sized pattern are alternately repeatedly formed, and the nano to micron sized pattern repeatedly comprises any one selected from the group consisting of a hemispherical shape, a triangular pyramidal shape, a quadrangular pyramidal shape, a hexagonal pyramidal shape, a conical shape and a cut-spherical shape.

12. The method of manufacturing a substrate for a high efficiency nitride-based light emitting diode on which a nano to micron sized pattern is formed, according to claim 11, wherein the convex section forming step comprises a nano imprinting method comprising:

a first step of forming a pattern material coating layer on the substrate using a solution comprising any one selected from the group consisting of a precursor of $SiO_2$, a precursor of $Si_3N_4$, and a combination thereof; and a second step of positioning and pressing a nano mold against the pattern material coating layer and forming the convex section.

13. The method of manufacturing a substrate for a high efficiency nitride-based light emitting diode on which a nano to micron sized pattern is formed, according to claim 11, wherein the convex section forming step comprises a nano printing method comprising:

a third step of forming a pattern material coating layer on one surface of a nano mold using a solution comprising any one selected from the group consisting of a precursor of $SiO_2$, a precursor of $Si_3N_4$, and a combination thereof; and a fourth step of positioning and pressing the nano mold having the pattern material coating layer thereon against the substrate and forming the convex section.

14. The method of manufacturing a substrate for a high efficiency nitride-based light emitting diode on which a nano to micron sized pattern is formed, according to claim 12, wherein the pressing of the nano imprinting is performed at 100 to 250° C. and 1 to 30 bars.

15. The method of manufacturing a substrate for a high efficiency nitride-based light emitting diode on which a nano to micron sized pattern is formed, according to claim 13, wherein the pressing of the nano printing is performed at 100 to 250° C. and 1 to 30 bars.

* * * * *